(12) United States Patent
Anderson et al.

(10) Patent No.: US 12,315,776 B2
(45) Date of Patent: May 27, 2025

(54) INTEGRATED DEVICE PACKAGE WITH AN INTEGRATED HEAT SINK

(71) Applicant: ANALOG DEVICES, INC., Wilmington, MA (US)

(72) Inventors: Michael John Anderson, Campbell, CA (US); Edward Olsen, Kalaheo, HI (US)

(73) Assignee: ANALOG DEVICES, INC., Wilmington, MA (US)

( * ) Notice: Subject to any disclaimer, the term of this patent is extended or adjusted under 35 U.S.C. 154(b) by 438 days.

(21) Appl. No.: 17/454,009

(22) Filed: Nov. 8, 2021

(65) Prior Publication Data

US 2023/0142729 A1    May 11, 2023

(51) Int. Cl.
| | |
|---|---|
| *H01L 23/367* | (2006.01) |
| *H01L 21/48* | (2006.01) |
| *H01L 21/56* | (2006.01) |
| *H01L 23/31* | (2006.01) |

(52) U.S. Cl.
CPC ...... *H01L 23/3672* (2013.01); *H01L 21/4871* (2013.01); *H01L 21/56* (2013.01); *H01L 23/3107* (2013.01); *H01L 23/3157* (2013.01)

(58) Field of Classification Search
CPC . H01L 23/3672; H01L 21/4871; H01L 21/56; H01L 23/3107; H01L 23/3158; H01L 23/3736; H01L 23/3732; H01L 23/3677; H01L 23/5389; H01L 2023/405; H01L 2924/15; H01L 24/01

See application file for complete search history.

(56) References Cited

U.S. PATENT DOCUMENTS

| | | |
|---|---|---|
| 4,303,934 A | 12/1981 | Stitt |
| 5,247,597 A | 9/1993 | Blacha et al. |
| 5,293,069 A | 3/1994 | Kato et al. |
| 5,689,091 A | 11/1997 | Hamzehdoost et al. |
| 5,940,272 A | 8/1999 | Emori et al. |
| 6,150,725 A | 11/2000 | Wenzel et al. |
| 6,282,095 B1 | 8/2001 | Houghton et al. |

(Continued)

FOREIGN PATENT DOCUMENTS

| | | |
|---|---|---|
| EP | 4177946 | 1/2025 |
| JP | 2004200316 A | 7/2004 |
| JP | 6737009 B2 | 7/2020 |

OTHER PUBLICATIONS

European Search Report issued Sep. 29, 2015 in European Patent Application No. 14152487.6 filed Jan. 24, 2014, in 5 pages.

(Continued)

*Primary Examiner* — Galina G Yushina
(74) *Attorney, Agent, or Firm* — Knobbe, Martens, Olson & Bear, LLP

(57) ABSTRACT

An integrated device package is disclosed. The integrated device package can include an electronic component package which includes an electronic component. The integrated device package can include a protective material in which the electronic component is at least partially embedded, wherein the electronic component package comprises a first surface and a second surface. The integrated device package can include a heat sink plated on the first surface. The heat sink can include a base portion and a plurality of heat-dissipating projections extending outwardly therefrom.

23 Claims, 6 Drawing Sheets

(56) References Cited

U.S. PATENT DOCUMENTS

| | | |
|---|---|---|
| 6,326,611 B1 | 12/2001 | Kennedy et al. |
| 6,388,336 B1 | 5/2002 | Venkateshwaran et al. |
| 6,441,475 B2 | 8/2002 | Zandman et al. |
| 6,459,581 B1 | 10/2002 | Newton et al. |
| 6,469,606 B1 | 10/2002 | Tada et al. |
| 6,489,686 B2 | 12/2002 | Farooq et al. |
| 6,490,161 B1 | 12/2002 | Johnson |
| 6,657,311 B1 | 12/2003 | Hortaleza et al. |
| 6,723,585 B1 | 4/2004 | Tu et al. |
| 6,777,789 B1 | 8/2004 | Glenn et al. |
| 6,787,916 B2 | 9/2004 | Halahan |
| 6,815,829 B2 | 11/2004 | Shibata |
| 6,821,817 B1 | 11/2004 | Thamby et al. |
| 6,825,108 B2 | 11/2004 | Khan et al. |
| 6,921,968 B2 | 7/2005 | Chung |
| 7,196,411 B2 | 3/2007 | Chang |
| 7,209,362 B2 | 4/2007 | Bando |
| 7,217,994 B2 | 5/2007 | Xiaoqi et al. |
| 7,224,058 B2 | 5/2007 | Fernandez |
| 7,249,752 B1 | 7/2007 | Foley |
| 7,408,244 B2 | 8/2008 | Lee et al. |
| 7,411,281 B2 | 8/2008 | Zhang |
| 7,489,025 B2 | 2/2009 | Chen et al. |
| 7,541,644 B2 | 6/2009 | Hirano et al. |
| 7,572,680 B2 | 8/2009 | Hess et al. |
| 7,619,303 B2 | 11/2009 | Bayan |
| 7,745,927 B2 | 6/2010 | Ryan et al. |
| 7,858,437 B2 | 12/2010 | Jung et al. |
| 7,911,059 B2 | 3/2011 | Cheng et al. |
| 7,998,791 B2 | 8/2011 | Chong et al. |
| 8,080,925 B2 | 12/2011 | Berger et al. |
| 8,115,307 B2 | 2/2012 | Toyama et al. |
| 8,284,561 B2 | 10/2012 | Su et al. |
| 8,399,994 B2 | 3/2013 | Roh et al. |
| 8,653,635 B2 | 2/2014 | Gowda et al. |
| 8,759,147 B2 | 6/2014 | Choi et al. |
| 8,772,817 B2 | 7/2014 | Yao |
| 8,842,951 B2 | 9/2014 | Doscher et al. |
| 9,156,673 B2 | 10/2015 | Bryzek et al. |
| 9,195,055 B2 | 11/2015 | Oberst et al. |
| 9,214,404 B1 | 12/2015 | Margomenos et al. |
| 9,240,394 B1 | 1/2016 | Ben Jamaa et al. |
| 9,484,313 B2 | 11/2016 | Chung et al. |
| 9,659,844 B2 | 5/2017 | Mukhopadhyay et al. |
| 9,735,084 B2 | 8/2017 | Katkar et al. |
| 10,121,766 B2 | 11/2018 | Monroe |
| 10,121,768 B2 | 11/2018 | Lin et al. |
| 10,651,109 B2 | 5/2020 | Abd Hamid et al. |
| 11,296,005 B2 | 4/2022 | Hall et al. |
| 2002/0090749 A1 | 7/2002 | Simmons et al. |
| 2003/0104651 A1 | 6/2003 | Kim et al. |
| 2004/0007750 A1 | 1/2004 | Anderson et al. |
| 2005/0046003 A1 | 3/2005 | Tsai |
| 2005/0101161 A1 | 5/2005 | Weiblen et al. |
| 2005/0104196 A1 | 5/2005 | Kashiwazaki |
| 2005/0285239 A1 | 12/2005 | Tsai et al. |
| 2006/0038651 A1 | 2/2006 | Mizushima et al. |
| 2006/0131735 A1 | 6/2006 | Ong et al. |
| 2006/0138622 A1 | 6/2006 | Lu et al. |
| 2006/0145804 A1 | 7/2006 | Matsutani et al. |
| 2006/0261453 A1 | 11/2006 | Lee et al. |
| 2008/0079524 A1 | 4/2008 | Suzuki |
| 2008/0157344 A1 | 7/2008 | Chen et al. |
| 2008/0290502 A1 | 11/2008 | Kutlu |
| 2008/0315390 A1 | 12/2008 | Kuhmann et al. |
| 2009/0032926 A1 | 2/2009 | Sharifi |
| 2009/0070727 A1 | 3/2009 | Solomon |
| 2009/0079528 A1 | 3/2009 | Shabany et al. |
| 2009/0282917 A1 | 11/2009 | Acar |
| 2010/0019393 A1 | 1/2010 | Hsieh et al. |
| 2010/0128441 A1 | 5/2010 | Soda et al. |
| 2010/0133555 A1* | 6/2010 | Negley ............... H01L 33/486 257/E33.068 |
| 2010/0133629 A1 | 6/2010 | Zhang et al. |
| 2010/0155925 A1* | 6/2010 | Kunimoto ........... H01L 23/5389 257/690 |
| 2010/0187557 A1 | 7/2010 | Samoilov et al. |
| 2010/0200998 A1 | 8/2010 | Furuta et al. |
| 2010/0244217 A1 | 9/2010 | Ha et al. |
| 2011/0024899 A1 | 2/2011 | Masumoto et al. |
| 2011/0062572 A1 | 3/2011 | Steijer et al. |
| 2011/0109287 A1* | 5/2011 | Nakamura .......... H01L 23/3107 323/282 |
| 2011/0133847 A1 | 6/2011 | Ogura et al. |
| 2011/0163428 A1 | 7/2011 | Galera et al. |
| 2011/0242775 A1 | 10/2011 | Schaible et al. |
| 2012/0027234 A1 | 2/2012 | Goida |
| 2012/0098117 A1 | 4/2012 | Sato et al. |
| 2012/0241925 A1 | 9/2012 | Yoon et al. |
| 2013/0032388 A1 | 2/2013 | Lin et al. |
| 2013/0068509 A1 | 3/2013 | Pyeon |
| 2013/0069218 A1 | 3/2013 | Seah |
| 2013/0240368 A1* | 9/2013 | Allardyce ................ C25D 7/06 205/210 |
| 2013/0270684 A1 | 10/2013 | Negishi et al. |
| 2013/0334051 A1* | 12/2013 | Chen ..................... C25D 5/16 204/279 |
| 2014/0027867 A1 | 1/2014 | Goida |
| 2014/0191419 A1 | 7/2014 | Mallik et al. |
| 2014/0197913 A1 | 7/2014 | Ohoka et al. |
| 2014/0209168 A1 | 7/2014 | Zhamu et al. |
| 2014/0217566 A1 | 8/2014 | Goida et al. |
| 2014/0252569 A1 | 9/2014 | Ikuma et al. |
| 2015/0021754 A1 | 1/2015 | Lin et al. |
| 2015/0084180 A1 | 3/2015 | Seko et al. |
| 2015/0210538 A1 | 7/2015 | Su et al. |
| 2015/0235915 A1 | 8/2015 | Liang et al. |
| 2015/0249070 A1* | 9/2015 | Illek .................... H01L 25/0753 257/89 |
| 2015/0255380 A1* | 9/2015 | Chen .................... H01L 23/367 361/707 |
| 2015/0303164 A1* | 10/2015 | Chen ...................... H01L 24/33 361/720 |
| 2016/0046483 A1 | 2/2016 | Cheng et al. |
| 2016/0064355 A1 | 3/2016 | Pan et al. |
| 2016/0090298 A1 | 3/2016 | Sengupta et al. |
| 2016/0167951 A1 | 6/2016 | Goida |
| 2017/0062340 A1 | 3/2017 | Ushijima |
| 2017/0196075 A1* | 7/2017 | Barron .................... H01L 23/40 |
| 2017/0345736 A1 | 11/2017 | Miyairi |
| 2017/0345788 A1 | 11/2017 | Pan et al. |
| 2018/0026008 A1 | 1/2018 | Jeng et al. |
| 2018/0061560 A1 | 3/2018 | Wukovits et al. |
| 2018/0175011 A1* | 6/2018 | Sung .................... H01L 21/565 |
| 2018/0261586 A1 | 9/2018 | Scanlan |
| 2018/0283808 A1 | 10/2018 | Muira et al. |
| 2018/0332731 A1 | 11/2018 | Kita |
| 2019/0035543 A1 | 1/2019 | Suzuki et al. |
| 2019/0181116 A1 | 6/2019 | Lin |
| 2019/0181259 A1* | 6/2019 | Hino .................... H01L 29/0615 |
| 2019/0333876 A1 | 10/2019 | Yudanov |
| 2019/0393127 A1 | 12/2019 | Truhitte |
| 2020/0152372 A1 | 5/2020 | Wei et al. |
| 2020/0194159 A1 | 6/2020 | Tsuchida et al. |
| 2020/0194161 A1 | 6/2020 | Hu et al. |
| 2021/0090970 A1 | 3/2021 | Hall et al. |
| 2021/0134510 A1 | 5/2021 | Anderson et al. |

OTHER PUBLICATIONS

Fairchild Semiconductor BGA 30L products page accessed on Apr. 19, 2012.

Kim et al., "Multi-flip chip on lead frame overmolded IC package: A novel packaging design to achieve high performance and cost effective module package," Electronic Components and Technology Conference, 2005, pp. 1819-1821.

Possum™ Die Design as a Low Cost 3D Packaging Alternative, accessed Jul. 26, 2019.

Examination Report received in Application No. 22205245 dated Jan. 15, 2024 in European Patent Application No. 22 205 245.8 filed Nov. 3, 2022, in 4 pages.

(56) References Cited

OTHER PUBLICATIONS

European Search Report issued Mar. 31, 2023 in European Patent Application No. 22 205 245.8 filed Nov. 3, 2022, in 8 pages.

\* cited by examiner

INTEGRATED DEVICE PACKAGE WITH AN INTEGRATED HEAT SINK

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field of the Invention

The field relates to an electronic device and, in particular, to an integrated device package with an embedded heat sink.

Description of the Related Art

Various electronic devices (e.g., high power regulators), due to various inefficiencies, generate heat that should be dissipated. Otherwise, the generated heat may degrade or limit the product performance. Accordingly, there is a continuing need for improved electronic devices with efficient solutions for dissipating the generated heat.

SUMMARY

In one embodiment, an integrated device package can include an electronic component package. The electronic component package can comprise an electronic component; and a protective material in which the electronic component is at least partially embedded. The electronic component package can comprise a first surface and a second surface; and a heat sink plated onto the first surface.

In some embodiments, the electronic component comprises a passive electronic device. In some embodiments, the electronic component comprises an integrated device die. In some embodiments, the electronic component is partially embedded within the protective material, the heat sink plated onto an exposed surface of the electronic component. In some embodiments, the electronic component comprises an insulating layer over the protective material, wherein the electronic component is completely embedded within the protective material, the heat sink plated onto the insulating layer. In some embodiments, the electronic component is completely embedded within the protective material. In some embodiments, the heat sink is connected to the electronic component by at least one via, the at least one via disposed within the protective material and connecting the heat sink and the electronic component at least thermally. In some embodiments, the heat sink comprises a shaped metal layer provided over the first surface of the electronic component package. In some embodiments, the heat sink comprises a base portion and a plurality of projections extending in a direction away from the electronic component, the projections comprising fins spaced apart along one dimension of the first surface. In some embodiments, the heat sink comprises a base portion and a plurality of projections extending in a direction away from the electronic component, the projections comprising pins spaced apart in a two-dimensional (2D) array along a width and a length of the first surface.

In another embodiment, a method of manufacturing an integrated device package is disclosed. The method can include: at least partially embedding an electronic component within a protective material of an electronic component package, the electronic component package comprising a first surface and a second surface; and electroplating a heat sink onto the first surface.

In some embodiments, the electronic component comprises a passive electronic device. In some embodiments, the electronic component comprises an integrated device die. In some embodiments, at least partially embedding the electronic component comprises partially embedding the electronic component within the protective material so as to expose at least a portion of the electronic component through the protective material. In some embodiments, electroplating the heat sink comprises adding a metal layer over the first surface and plating the metal layer such that the metal layer directly contacts the electronic component. In some embodiments, at least partially embedding the electronic component comprises completely embedding the electronic component within the protective material. In some embodiments, electroplating the heat sink comprises adding a metal layer over the first surface and plating the metal layer such that the metal layer contacts an insulating layer over the protective material. In some embodiments, electroplating the heat sink comprises adding a metal layer over the first surface and forming, by a photolithography process, the metal layer in a shape for dissipating heat. In some embodiments, forming the metal layer in the shape for dissipating the heat comprises forming a plurality of projections extending in a direction away from the electronic component, the projections comprising fins spaced apart along one dimension of the first surface, wherein the space between the fins comprises a plurality of insulating portions. In some embodiments, forming the metal layer in the shape for dissipating the heat comprises forming a plurality of projections extending in a direction away from the electronic component, the projections comprising pins spaced apart in a two-dimensional (2D) array along a width and a length of the first surface, wherein the space between the pins comprises a plurality of insulating portions.

BRIEF DESCRIPTION OF THE DRAWINGS

Embodiments of this disclosure will now be described, by way of non-limiting example, with reference to the accompanying drawings.

DETAILED DESCRIPTION

Electronic devices, including integrated circuit dies, can comprise devices that generate a significant amount of power. Heat generated from the dies can be dissipated in a variety of ways. With respect to electronic devices that generate heat, there are several ways in which the heat can be dissipated. An example heat dissipation pathway includes a pathway down into the system board (i.e., by a thermally-conductive pathway to the board). In many cases, the system boards are very dense and have many heat-generating components, and it is not feasible or desirable to pull all of the heat through the system board. Thus, other structures (e.g., heat sinks, cold plates, fans, etc.) are utilized with the electronic devices to improve the heat dissipation through the top of the components.

Some solutions typically add the other structures such as heat sinks as separate components. These increase cost (e.g., via added material and processes) and are not as efficient because of high thermally resistant polymers and adhesives used to attach, e.g., the heat sinks to the electronic devices.

Thus, as described herein, the package manufacturing process (e.g., to embed a die or component into a molding material) can be used to add an integrated heat sink into an electronic component package, which would not incur the increased costs discussed above. For example, a final top metal layer can be added and patterned to provide increased surface area to improve the convection cooling and heat dissipation characteristics of the package. The top metal pattern can mimic a heat sink (e.g., a pin-type or fin-type heat sink), but can be manufactured using plating technologies rather than being adhered to the package.

Figure 1:
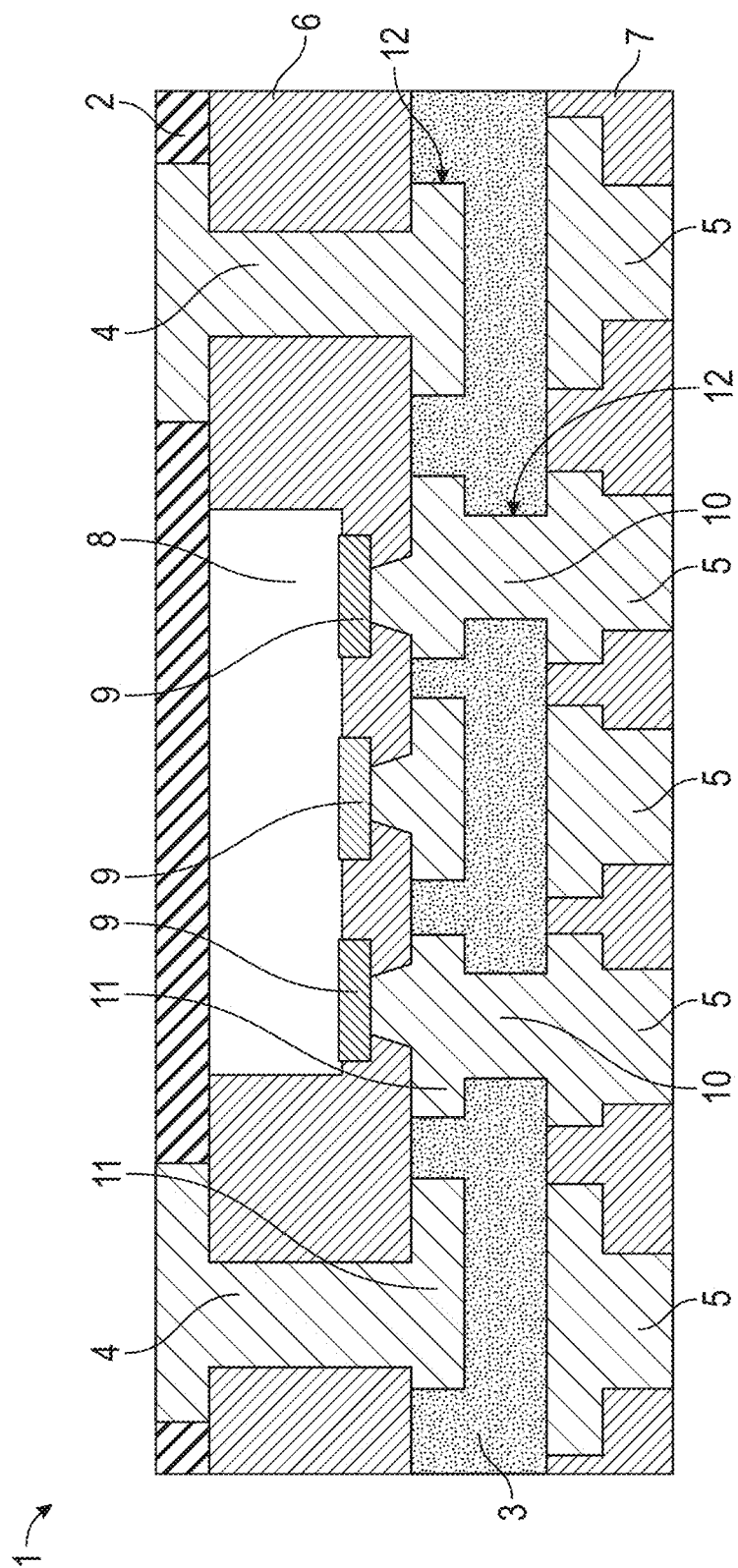
FIG. 1 is a schematic side sectional view of an electronic component package.

FIG. 1 is a schematic side sectional view of an electronic component package 1, according to some implementations. The electronic component package 1 can be used in any suitable type of electronic system, and can be packaged in any suitable manner. The electronic component package 1 can include a first insulating layer 2, a second insulating layer 3, a plurality of first vias 4, a plurality of second vias 10, a plurality of laterally-extending traces 11, a plurality of packaging terminations 5, a protective material 6, a second layer 7 of protective material, an electronic component 8 and a plurality of contact pads 9 that electrically connect the component 8 to the metallization 12. The metallization 12 can comprise any suitable type of metal, such as, e.g., copper, as would be known to one of ordinary skill in the art. In various embodiments, the protective material can comprise an organic or polymer coating. For example, the protective material can comprise a molding compound in some embodiments. In other embodiments, the protective material can comprise a film, e.g., an organic epoxy resin which may include inorganic microparticle fillers, such as Ajinomoto Build-up Film (ABF), sold by Ajinomoto Group of Tokyo, Japan.

The electronic component 8 can comprise any suitable type of electronic component, such as an integrated device die (which can include active circuitry therein), a passive electronic device (such as a capacitor, an inductor, a resistor, a transformer, etc.), or any other suitable type of device. The component 8 can connect to the metallization 12 by way of the contact pads 9.

As shown, the electronic component 8 can be embedded within the protective material 6, and coupled to the packaging terminations 5 through the contact pads 9 and the second vias 10. The electronic component 8 can be placed between the first insulating layer 2 and the second insulating layer 3, wherein the first insulating layer 2 and the second insulating layer 3 can be connected by the first vias 4. The second insulating layer 3 can be placed over a substrate such as a system board, e.g., a PCB (printed circuit board) (not shown). The packaging terminations 5 can be, e.g., a BGA (Ball Grid Array) or an LGA (Land Grid Array), and provide electrical connection to the PCB. The metallization 12 can include the vias 4, 10 which provide vertical communication through the protective material 6 and the second insulating layer 3, respectively. The metallization 12 can also include the laterally-extending traces 11 that provide horizontal electrical communication within the package 1.

Figure 2:
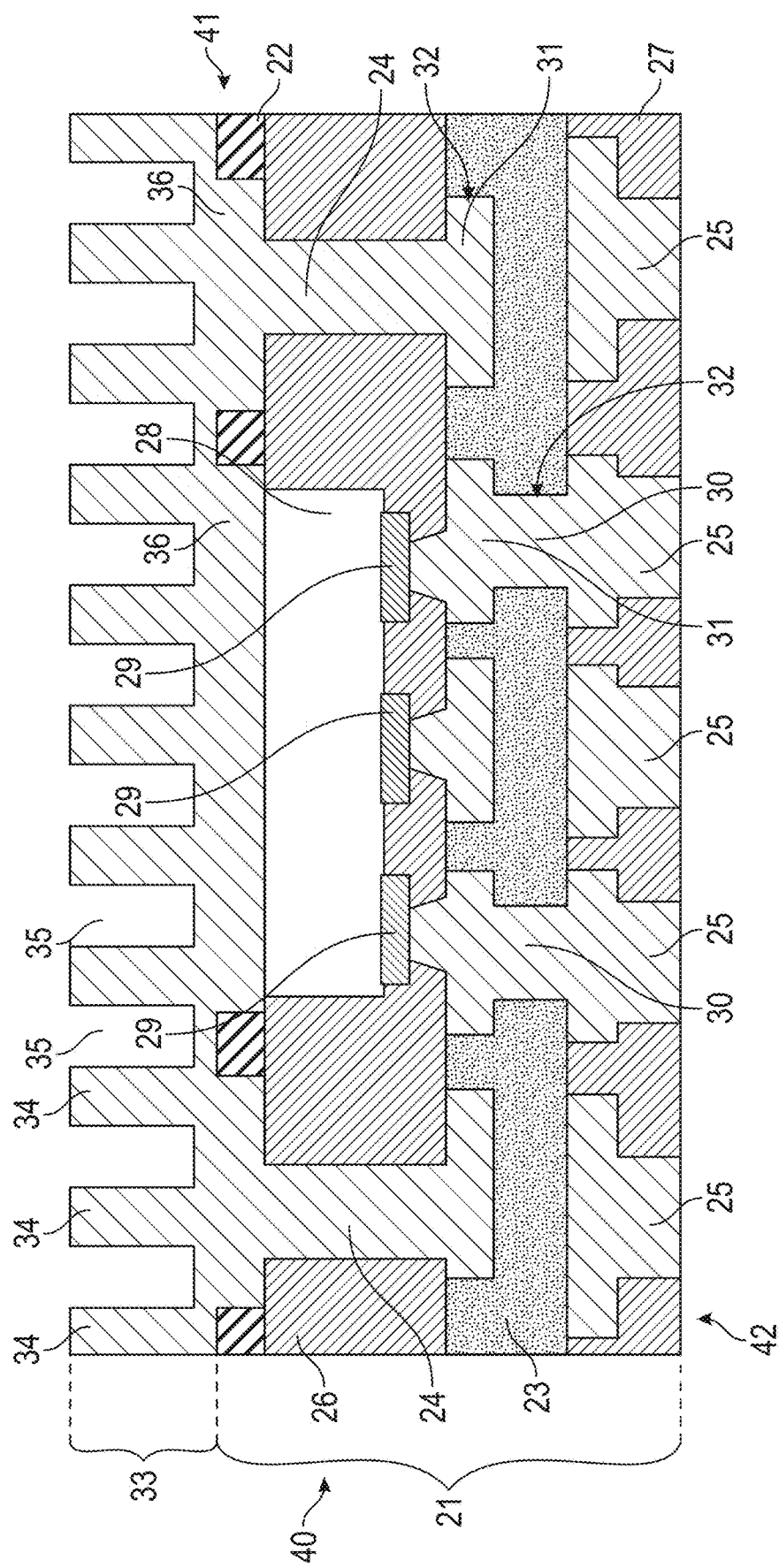
FIG. 2 is a schematic side sectional view showing an example of an integrated device package including an integrated heat sink, according to an embodiment.

FIG. 2 is a schematic side sectional view showing an example of an integrated device package 40 including an integrated heat sink 33, according to an embodiment. The integrated device package 40 can also be used in any suitable type of electronic system. For example, the integrated device package 40 can be utilized for a high power application (e.g., a high power regulator). The integrated device package 40 can include an electronic component package 21 and the integrated heat sink 33. The electronic component package 21 can include a first insulating layer 22, a second insulating layer 23, a plurality of first vias 24, a plurality of second vias 30, a plurality of laterally-extending traces 31, a plurality of packaging terminations 25, a protective material 26, a second layer 27 of protective material, an electronic component 28 and a plurality of contact pads 29 (which electrically connect the electronic component 28 to the metallization 32), as well as a first surface 41 and a second surface 42. The metallization 32 can include the vias 24, 30 which provide vertical communication through the protective material 26 and the second insulating layer 23, respectively. Furthermore, the metallization 32 can also include the laterally-extending traces 31 that provide horizontal electrical communication within the integrated device package 40. In some embodiments, the metallization 12 can comprise any suitable type of metal, such as, e.g., copper, as would be known to one of ordinary skill in the art. The heat sink 33 can include a plurality of projections 34 and a plurality of insulating portions 35 between corresponding projections 34. The insulating portions 35 can comprise a gas (e.g., air) in some embodiments, such that the gas is provided between the projections 34. In other embodiments, however, a solid state insulating materials (such as an organic or inorganic dielectric) can serve as the insulating portions 35 between adjacent projections 34.

The electronic component 28 can comprise any suitable type of electronic component, such as an integrated device die (which can include active circuitry therein), a passive electronic device (such as a capacitor, an inductor, a resistor, a transformer, etc.), or any other suitable type of device. The electronic component 28 can connect to the metallization 32 by way of the contact pads 29.

As shown, the electronic component 28 can be embedded within the protective material 26, and coupled to packaging terminations 25 through the contact pads 29 and the second vias 30. The electronic component 28 can be placed between the first insulating layer 22 and the second insulating layer 23, wherein the first insulating layer 22 and the second insulating layer 23 can be connected by the first vias 24. The second insulating layer 23 can be placed over a substrate such as a system board, e.g., a PCB (not shown) and coupled to the PCB, for example, by way of solder bumps (not shown). The packaging terminations 25 can be, e.g., a BGA or an LGA. The packaging terminations 25 can be disposed over the PCB and spaced apart along the second surface 42 in a pattern corresponding to, e.g., the BGA or the LGA, and provide electrical connection between the electronic component 28 and the PCB.

While not shown, in one embodiment, the electronic component 28 can comprise a die of one or more layers. In another embodiment, there can be more than one electronic component 28 embedded within the molding material 26.

In some high power applications, the foregoing structure of the electronic component package 21 can generate power of at least 100 W, at least 500 W, at least 1 kW, or at least 3 kW. In some embodiments, it can generate power in a range of 100 W to 5 KW, in a range of 500 W to 5 KW, in a range of 1 kW to 5 KW, or in a range of 3 kW to 5 kW. In some applications, it can operate at one or more frequencies in a range of 30 kHz to 3 MHz, in a range of 100 kHz to 3 MHz, or in a range of 1 MHz to 3 MHz. It can also accommodate high relative currents, including current in a range of 50 A to 1000 A, in a range of 100 A to 1000 A, or in a range of 500 A to 1000 A. In some embodiments, it can comprise a passive device, such as an inductor or transformer. In embodiments that include an inductor, the inductance can be at least 10 µH, at least 50 µH, or at least 100 µH, for example, in a range of 10 µH to 100 µH.

Accordingly, high power devices like those disclosed herein can generate significant heat. Thus, it can be important to effectively remove the generated heat from, e.g., the electronic component 28. As shown in FIG. 2, the heat sink 33 can be added to the first surface 41 of the electronic component package 21, to dissipate the generated heat. For example, based on the heat sink 33 directly contacting the first vias 24, most heat can be pulled away.

In one embodiment, the heat sink 33 can include the projections 34, which can be spaced apart by the insulating portions 35. The projections 34 can extend from a base portion that contacts the first surface 41, and away from the electronic component package 21. The first vias 24 can provide a thermal connection to the electronic component 28, and provide, e.g., a thermal pathway for the generated heat discussed herein to be dissipated from the component 28 through the heat sink 33. By providing a continuous connection between the vias 24, 30 and the heat sink 33 (i.e., without any added adhesive which may be highly thermally-resistant), the integrated device package 40 can achieve a more efficient heat dissipating characteristics than adding a heat sink with an adhesive.

In one embodiment, the heat sink 33 can comprise a metal layer that is added on the first surface 41 of the electronic component package 21. For example, the heat sink 33 can be added by, e.g., electroplating the heat sink 33 onto (e.g., directly onto) the first insulating layer 22 and the upper pads 36 of the metallization 32. In one embodiment, the dry film patterning or photolithography can allow the metal layer to be patterned to mimic a shape of a heat sink. For example, the metal layer can be plated with pins or fins. Electroplating the heat sink 33 onto the surface 41 of the electronic component package 21 can accordingly be performed without an adhesive between the electronic component package 21 and the heat sink 33. Accordingly, in the illustrated embodiment, the electroplated metallic portion of the heat sink 33 can directly contact the portions of the insulating layer 22 and the portions of the metallization 32 over which the heat sink is deposited. The patterned metal layer (i.e., the heat sink 33), with its increased surface area, can provide an improved heat dissipation for the integrated device package 40 with convective cooling. As shown, for example, the projections 34 can be spaced apart by the insulating portions 35, which can comprise a gas such as air or a solid-state insulating material, such that heat can be conveyed away from the integrated device package 40.

Various embodiments utilizing the plating and photolithography processes developed as part of an embedded die manufacturing process can employ an inductor/ferrite manufacturing process to provide a thermally enhanced integrated device package 40 (e.g., high power inductors and transformers). This can be achieved by manufacturing inductors using the different metal layers in the structure to create parallel inductor windings between the metal layers, and can be further improved by incorporating ferrous dielectric layers between the metal layers to increase the inductance. Because the plating and photolithography process are used to provide the heat sink 33, manufacturing of the integrated device package 40 provides a solution that does not add significantly to the material and process costs. By comparison, other solutions may experience increased material and processing costs, and may not be as efficient due to high thermally resistant polymers and adhesives used to attach separate components. In the embodiments disclosed herein, the integrated device package 40 with the integrated heat sink 33 can be integrated into a manufacturing process with little to no impact to pricing. Further, as explained above, increasing the available surface area of the heat sink by proper design of the heat sinks pins and fins for improved convective thermal dissipative properties can provide the ability to operate the finished module at high dissipative power densities.

Figure 3:
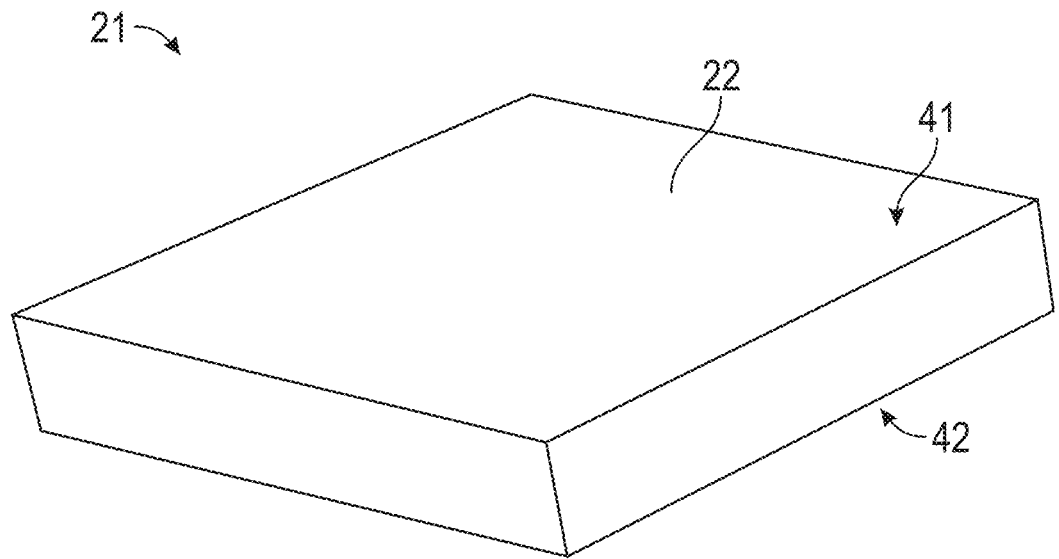
FIG. 3 is a schematic perspective view showing an example of an electronic component package before a heat sink is added.
Figure 4:
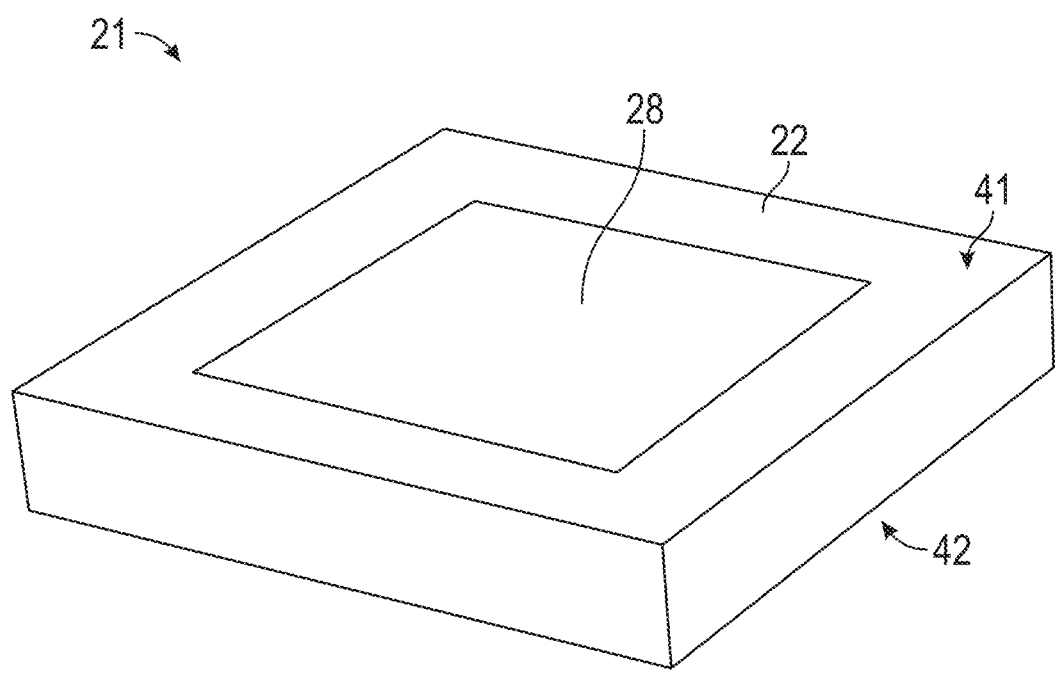
FIG. 4 is a schematic perspective view showing another example of an electronic component package before a heat sink is added.

In various embodiments, the heat sink 33 can be added onto (e.g., plated directly onto and contacting) the electronic component package 21 wherein the first surface 41 (FIG. 3) may be, in some embodiments, the first insulating layer 22 (i.e., the entire surface of the electronic component package 21 facing the heat sink 33) or, in other embodiments, the first insulating layer 22 and the exposed upper surface of the electronic component 28 (FIG. 4). This can be important when electrical isolation between the die and the heat sink is required.

Figure 5:
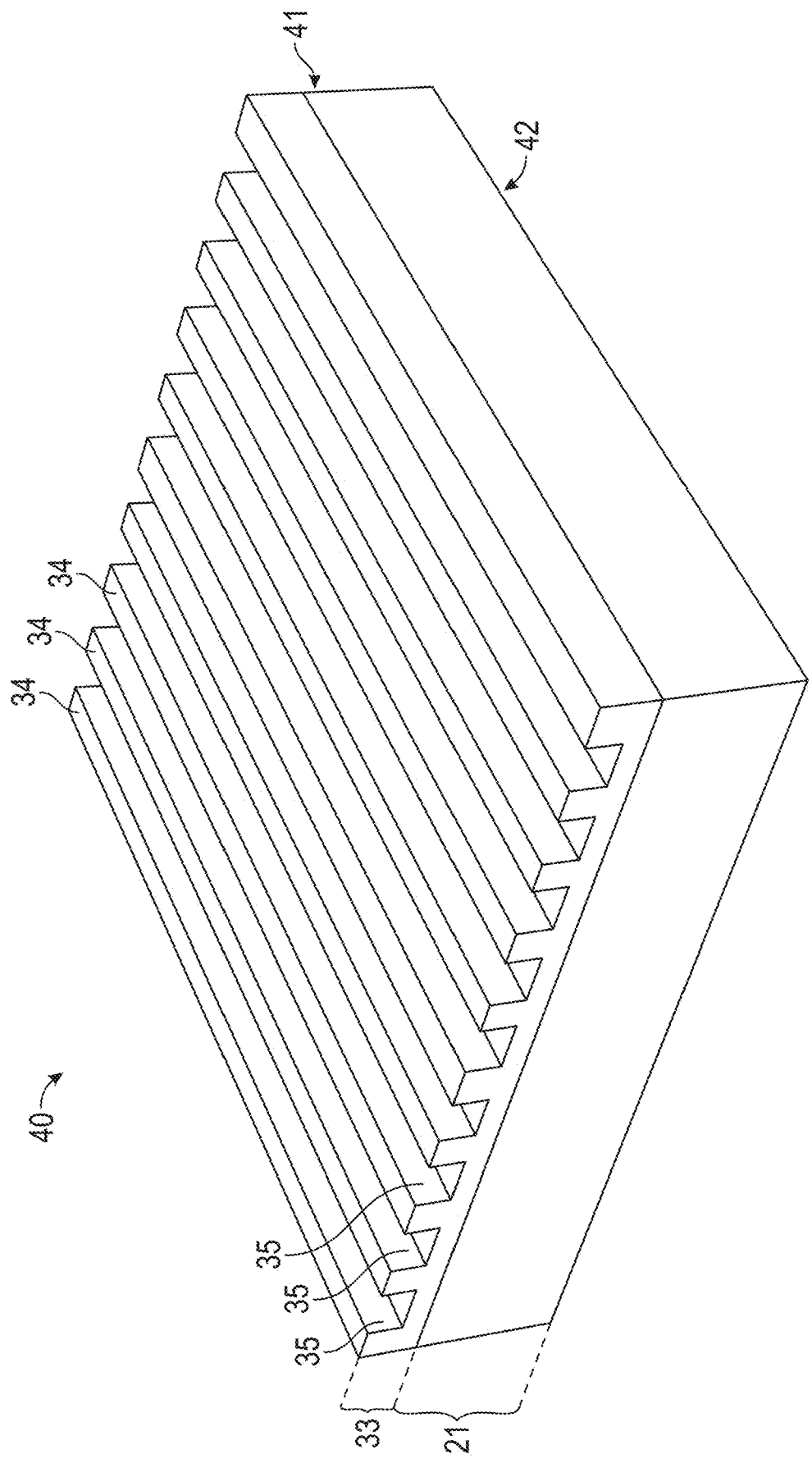
FIG. 5 is a schematic perspective view showing an example of an integrated device package with a heat sink including a plurality of elongate fins.
Figure 6:
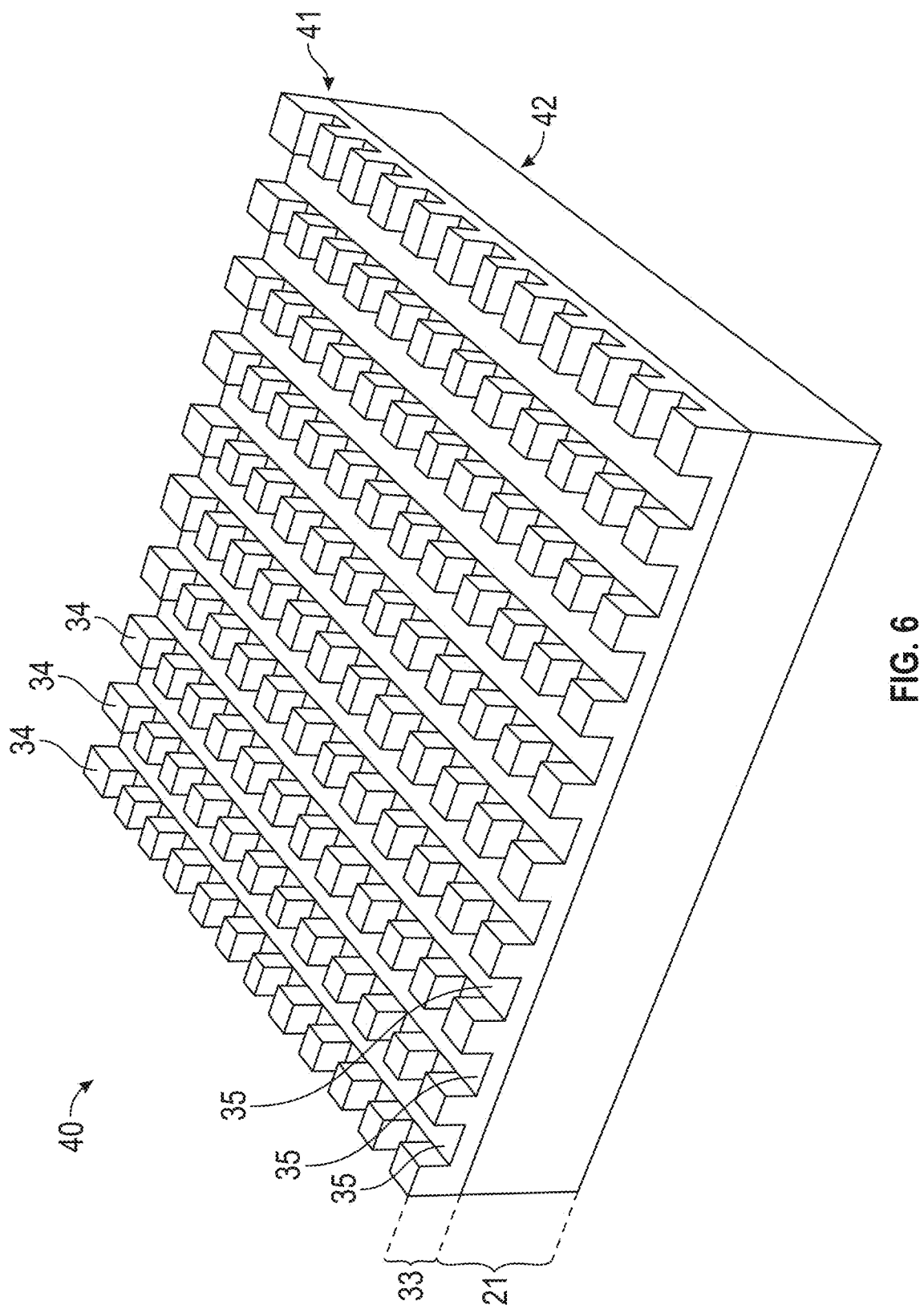
FIG. 6 is a schematic perspective view showing another example of an integrated device package with a heat sink including an array of vertically-extending pins.

Moreover, in various embodiments, the shape of the heat sink 33 can be formed or modified so as to include the heat-dissipating projections 34 as, e.g., a fin-type (FIG. 5) or pin-type (FIG. 6) heat sink. As illustrated herein in FIG. 5, for example, the projections 34 can comprise a plurality of elongated fins. The fins in FIG. 5 can extend across a width of the first surface 41. The fins in FIG. 5 can be spaced along a length of the first surface 41 in a one-dimensional (1D) array of projections 34. In other embodiments, as shown in FIG. 6, the projections 34 can comprise a plurality of pins disposed in an array over the first surface 41. The pins of FIG. 6 can be disposed in a two-dimensional (2D) array in which pins are spaced apart along the width and length of the first surface 41. Beneficially, the integrated device package 40 may not include a separate heat sink structure that is adhered with an adhesive.

As explained herein, the integrated device package 40 can include any suitable type of electronic component 28. For example, the electronic component 28 can comprise a semiconductor die, such as a processor die, a memory die, a sensor die, a microelectromechanical systems die, etc. The packaging terminations 25 can connect to any suitable carrier. In the illustrated embodiment, the packaging terminations 25 can be disposed on the second surface 42 of the electronic component package 21.

Figure 7:
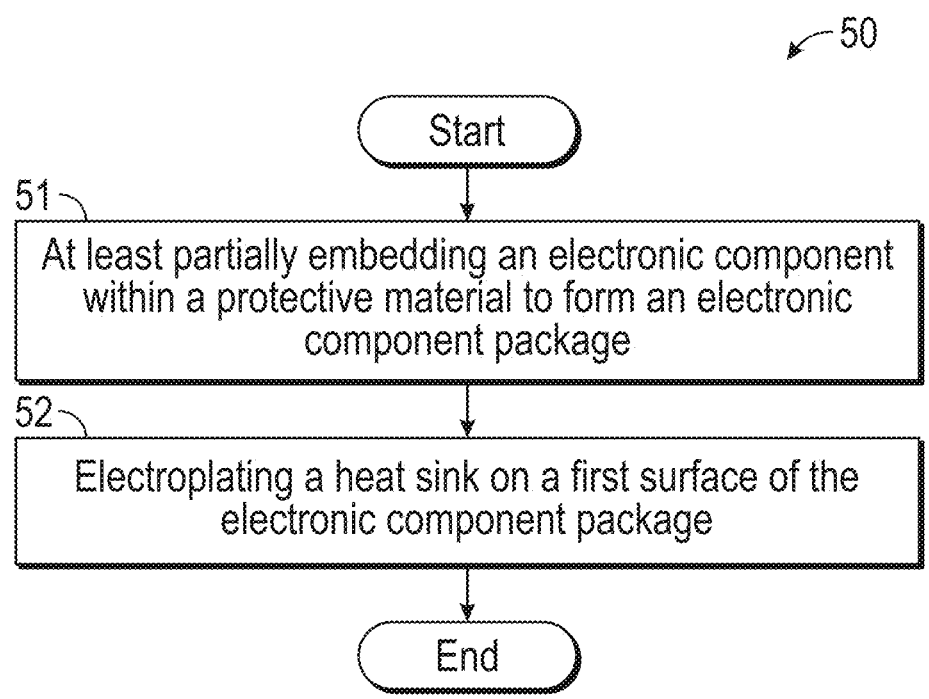
FIG. 7 is a flow chart showing a method of manufacturing an integrated device package including an embedded heat sink, according to an embodiment.

FIG. 7 is a flow chart showing a method 50 of manufacturing an integrated device package 40 including an integrated heat sink 33, according to an embodiment.

In step 51, the method 50 comprises at least partially embedding an electronic component 28 within a protective material 26. In one embodiment, the electronic component 28 can be only partially embedded within the protective material 26. For example, the electronic component 28 may be exposed through the protective material 26 in some embodiments (see FIG. 4). In another embodiment, the electronic component 28 can be embedded completely within both the first insulating layer 22 and the protective material 26 (see FIG. 3). In some embodiments, the integrated device package 40 can have additional vias (e.g., through the protective material 26) to at least thermally connect the electronic component 28 to the heat sink 33.

In step 52, the method 50 comprises electroplating a heat sink 33 on a first surface of an electronic component package 21. In one embodiment, as discussed herein, electroplating the heat sink 33 can include utilizing the plating and photolithography processes developed as part of an embedded die manufacturing process to provide a thermally enhanced integrated device package 40 (e.g., high power inductors and transformers). In the embodiments disclosed herein, the integrated device package 40 with the embedded heat sink 33 can be economically integrated into a molded packaging process. Further, as explained above, increasing the available surface area for improved convective thermal dissipative properties can provide the ability to operate the finished module at high dissipative power densities. Thus, while electroplating the heat sink 33 can comprise forming the projections 34 that are fin-type (FIG. 5) or pin-type (FIG. 6), it can also include forming the projections 34 in any other way so as to increase the available surface area of the heat sink 33 for heat dissipation.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. Regarding the word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. An integrated device package comprising:
   an electronic component package comprising:
      an electronic component;
      a protective material in which the electronic component is at least partially embedded; and
      a first insulating layer and a second insulating layer, the protective material disposed between the first insulating layer and the second insulating layer;
      wherein the electronic component package comprises a first surface and a second surface;
   an integrated heat sink electroplated onto and integrated with the first surface; and
   at least one via disposed within the protective material in which the electronic component is embedded within and connecting the integrated heat sink and the electronic component at least thermally by a continuous connection between the at least one via and the integrated heat sink, wherein the first insulating layer and the second insulating layer are connected by the at least one via;
   wherein the electronic component is partially embedded within the protective material, the integrated heat sink electroplated onto an exposed upper surface of the electronic component.

2. The integrated device package of claim 1, wherein the electronic component comprises a passive electronic device.

3. The integrated device package of claim 1, wherein the electronic component comprises an integrated device die.

4. The integrated device package of claim 1, wherein the integrated heat sink comprises a shaped metal layer provided over the first surface of the electronic component package.

5. The integrated device package of claim 1, wherein the integrated heat sink comprises a base portion and a plurality of projections extending in a direction away from the electronic component, the projections comprising fins spaced apart along one dimension of the first surface.

6. The integrated device package of claim 1, wherein the integrated heat sink comprises a base portion and a plurality of projections extending in a direction away from the electronic component, the projections comprising pins spaced apart in a two-dimensional (2D) array along a width and a length of the first surface.

7. The integrated device package of claim 1, wherein one or more packaging terminations disposed on the second surface of the electronic component package, the electronic component coupled to the one or more packaging terminations.

8. The integrated device package of claim 1, wherein the first surface comprises the first insulating layer and the exposed upper surface of the electronic component.

9. A method of manufacturing an integrated device package, the method comprising:
at least partially embedding an electronic component within a protective material of an electronic component package, the protective material disposed between a first insulating layer and a second insulating layer, the electronic component package comprising a first surface and a second surface;
electroplating an integrated heat sink onto the first surface; and
connecting the integrated heat sink and the electronic component at least thermally by a continuous connection with at least one via disposed within the protective material in which the electronic component is embedded within, the continuous connection between the at least one via and the integrated heat sink, wherein the first insulating layer and the second insulating layer are connected by the at least one via;
wherein at least partially embedding the electronic component comprises partially embedding the electronic component within the protective material so as to expose at least a portion of the electronic component through the protective material; and
wherein electroplating the integrated heat sink comprises adding a metal layer over the first surface and plating the metal layer such that the metal layer directly contacts the electronic component.

10. The method of claim 9, wherein the electronic component comprises a passive electronic device.

11. The method of claim 9, wherein the electronic component comprises an integrated device die.

12. The method of claim 9, wherein electroplating the integrated heat sink comprises adding a metal layer over the first surface and forming, by a photolithography process, the metal layer in a shape for dissipating heat.

13. The method of claim 12, wherein forming the metal layer in the shape for dissipating the heat comprises forming a plurality of projections extending in a direction away from the electronic component, the projections comprising fins spaced apart along one dimension of the first surface, wherein a space between adjacent fins comprises an insulating portion.

14. The method of claim 12, wherein forming the metal layer in the shape for dissipating the heat comprises forming a plurality of projections extending in a direction away from the electronic component, the projections comprising pins spaced apart in a two-dimensional (2D) array along a width and a length of the first surface, wherein a space between adjacent pins comprises a plurality of insulating portions.

15. The method of claim 9, further comprising connecting the electronic component to one or more packaging terminations disposed on the second surface of the electronic component package.

16. The method of claim 9, wherein electroplating the integrated heat sink comprises the integrated heat sink directly contacting an exposed upper surface of the electronic component.

17. An integrated device package comprising:
an electronic component package comprising:
an electronic component;
a protective material in which the electronic component is at least partially embedded; and
a first insulating layer and a second insulating layer, the protective material disposed between the first insulating layer and the second insulating layer;
wherein the electronic component package comprises a first surface and a second surface;
an integrated heat sink electroplated onto and integrated with the first surface; and
at least one via disposed within the protective material in which the electronic component is embedded within and connecting the integrated heat sink and the electronic component at least thermally by a continuous connection between the at least one via and the integrated heat sink, wherein the first insulating layer and the second insulating layer are connected by the at least one via;
wherein the integrated heat sink directly contacts an exposed upper surface of the electronic component.

18. The integrated device package of claim 17, wherein the electronic component comprises a passive electronic device.

19. The integrated device package of claim 17, wherein the electronic component comprises an integrated device die.

20. The integrated device package of claim 17, wherein the integrated heat sink comprises a shaped metal layer provided over the first surface of the electronic component package.

21. The integrated device package of claim 17, wherein the integrated heat sink comprises a base portion and a plurality of projections extending in a direction away from the electronic component, the projections comprising fins spaced apart along one dimension of the first surface.

22. The integrated device package of claim 17, wherein the integrated heat sink comprises a base portion and a plurality of projections extending in a direction away from the electronic component, the projections comprising pins spaced apart in a two-dimensional (2D) array along a width and a length of the first surface.

23. The integrated device package of claim 17, wherein one or more packaging terminations disposed on the second surface of the electronic component package, the electronic component coupled to the one or more packaging terminations.

* * * * *